US008343814B2

United States Patent
Bucki et al.

(10) Patent No.: US 8,343,814 B2
(45) Date of Patent: Jan. 1, 2013

(54) COMPACT MULTI-PORT CAM CELL IMPLEMENTED IN 3D VERTICAL INTEGRATION

(75) Inventors: Robert J. Bucki, Cary, NC (US); Jagreet S. Atwal, Carrboro, NC (US); Joseph S. Barnes, Chapel Hill, NC (US); Kerry Bernstein, Underhill, VT (US); Eric Robinson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/542,235

(22) Filed: Aug. 17, 2009

(65) Prior Publication Data

US 2009/0305462 A1  Dec. 10, 2009

Related U.S. Application Data

(62) Division of application No. 11/750,631, filed on May 18, 2007.

(51) Int. Cl.
*H01L 21/335* (2006.01)

(52) U.S. Cl. .. 438/142; 438/199; 257/213; 257/E21.614

(58) Field of Classification Search .............. 438/150, 438/142, 199; 257/690, 74, 774, E23.085, 257/E25.006, E27.064, 213, E21.614
See application file for complete search history.

(56) References Cited

U.S. PATENT DOCUMENTS

| | | | |
|---|---|---|---|
| 4,398,248 A | 8/1983 | Hsia et al. | |
| 4,897,708 A * | 1/1990 | Clements | 257/690 |
| 6,490,571 B1 | 12/2002 | Cooper | |
| 6,551,857 B2 | 4/2003 | Leedy | |
| 6,707,718 B1 | 3/2004 | Halim et al. | |
| 6,821,826 B1 * | 11/2004 | Chan et al. | 438/150 |
| 7,117,301 B1 | 10/2006 | James et al. | |
| 2004/0132231 A1 | 7/2004 | Leedy | |
| 2004/0212395 A1 | 10/2004 | Madurawe | |
| 2004/0223364 A1 | 11/2004 | Srivastavaan et al. | |
| 2005/0023656 A1 | 2/2005 | Leedy | |
| 2005/0067620 A1 | 3/2005 | Chan et al. | |
| 2006/0033110 A1 * | 2/2006 | Alam et al. | 257/74 |
| 2007/0228383 A1 * | 10/2007 | Bernstein et al. | 257/74 |
| 2008/0291767 A1 * | 11/2008 | Barnes et al. | 365/230.05 |
| 2009/0305462 A1 * | 12/2009 | Bucki et al. | 438/107 |

OTHER PUBLICATIONS

U.S. Office Action dated Feb. 14, 2011 issued in related U.S. Appl. No. 11/750,631.
U.S. Office Action dated Oct. 31, 2011 issued in related U.S. Appl. No. 11/750,631.

* cited by examiner

*Primary Examiner* — Jerome Jackson, Jr.
*Assistant Examiner* — Fang-Xing Jiang
(74) *Attorney, Agent, or Firm* — Scully, Scott, Murphy & Presserm P.C.; Vazken Alexanian

(57) ABSTRACT

A multi-ported CAM cell in which the negative effects of increased travel distance have been substantially reduced is provided. The multi-ported CAM cell is achieved in the present invention by utilizing three-dimensional integration in which multiple active circuit layers are vertically stack and vertically aligned interconnects are employed to connect a device from one of the stacked layers to another device in another stack layer. By vertically stacking multiple active circuit layers with vertically aligned interconnects, each compare port of the multi-port CAM can be implemented on a separate layer above or below the primary data storage cell. This allows the multi-port CAM structure to be implemented within the same area footprint as a standard Random Access Memory (RAM) cell, minimizing data access and match compare delays. Each compare match line and data bit line has the length associated with a simple two-dimensional Static Random Access Memory (SRAM) cell array.

20 Claims, 8 Drawing Sheets

Flat CAM Cell

3-D Multiport CAM

COMPACT MULTI-PORT CAM CELL IMPLEMENTED IN 3D VERTICAL INTEGRATION

CROSS-REFERENCE TO RELATED APPLICATIONS

This application is a divisional of U.S. Ser. No. 11/750,631, filed May 18, 2007, the entire contents of which are incorporated herein by reference.

BACKGROUND

The present invention relates to a semiconductor structure and a method of fabricating the same. More particularly, the present invention relates to a multi-port Content Addressable Memory (CAM) cell in which each compare port of the CAM cell is located in a separate layer vertically abutting the primary data storage cell. The present invention also provides a method of forming such a multi-ported CAM cell in which three-dimensional (3D) integration is employed in forming the same.

Nearly every modern microprocessor employs a cache whereby some instructions and/or data are kept in storage that is physically closer and more quickly accessible than from the main memory. This type of storage is commonly known as a cache. When the cache is tightly integrated into the processor's execution pipeline, it's called an L1 (e.g., Level 1) cache.

FIG. 1 shows a system-level representation of a prior art microprocessor 108 (e.g., CPU) and its connection to a memory subsystem. In this example, the microprocessor includes an L1 instruction cache 100 and an L1 data cache 102. The system also includes an L2 cache 104 that holds both instructions and data as well as an L3 cache 106 that backs up the L2 cache 104.

Microprocessor performance is tied very closely to the access time of the L1 data cache. In fact, this is of such importance that the access time of the L1 data cache 102 plays a central role in determining the microprocessor frequency target. One of the "tricks" sometimes employed by logic designers to improve L1 data cache 102 access time is to use a CAM-based approach instead of the more traditional directory-based approach, which is typically used in L2 cache 104 designs.

FIG. 2 is a block representation of a CAM-based L1 data cache. Rather than having a separated directory plus data arrays as in a traditional directory-based approach, in a CAM-based L1 data cache, the directory and the data array are designed to work as a single structure. The CAM (Content Addressable Memory) has a tag region 206 that keeps the addresses of all of the lines in the cache and a data region 208 that keeps the data for all of the lines in the cache.

In a directory-based cache, the microprocessor searches the cache by selecting a few lines in the directory (typically 1-8 lines) to read and then sends them thru comparators to determine whether there's a "hit". In some implementations, the comparator results form part of the address used to read from a separate data array. In other implementations, the data array reads all of the possible "hit" locations concurrently with the directory read-compare operation and then uses the "hit" results to select which data is actually being requested by the microprocessor.

In a CAM-based cache, the microprocessor searches the cache by comparing the search tag 226 vs. all of the cache's valid tags at once and then using the compare results (match lines 204) as a decoded address into the data region 208 for the read. Only the data that's desired is read out 224, and there is no multiplexor after the data region read that's waiting on the directory hit results. The match lines 204 also go through a reduction OR to produce the lookup results 222 that indicate whether the search found a hit or was a miss.

There are several operations within the microprocessor that require a tag search on the L1 data cache. A load operation wants to read data from memory and place it into a register. As the load is executed, it first makes a load request 216 to the cache control arbiter 202 to perform an L1 data cache lookup. A lookup is defined as a tag search plus data read if a tag match is found. A load request 216 has an associated load address 210 that's used to form the search tag 226 for the load. A store operation wants to write data to memory. As the store is executed, it first makes a store request 218 to the cache control arbiter 202 to perform an L1 data cache search. A store request 218 has an associated store address 212 that's used to form the search tag 226 for the store. If there is a hit, the store requester is informed of the location of the hit so that it knows where in the cache to write the store's data or whether to send the store request to the L2 cache 104 or to the memory. A snoop operation wants to know whether a line is in the cache, sometimes for the purpose of invalidating the line from the cache. As the snoop is executed, it first makes a snoop request 220 to the cache control arbiter 202 in order to perform an L1 data cache search. A snoop request 220 has an associated snoop address 214 that's used to form the search tag 226 for the snoop. If there is a hit, the snoop requestor is informed of the location of the hit so that it knows which tag to invalidate if it needs to do so.

For each request type (load, store, snoop) the cache control arbiter 202 selects one of the requests and tells the search tag multiplexor (e.g., mux) 200 which address to choose in order to form the search tag. The selected request then performs its cache operation. The other requests, if present, must wait until the next arbitration cycle to try again. This means that when there are simultaneous requests among more than one of the requesters, that some requests are delayed from being granted access to the cache. This delay reduces the performance of the microprocessor by adding latency to the "losing" operations.

It would be beneficial to have a multi-ported CAM that would allow more than one CAM search to be performed simultaneously. This would increase the bandwidth of the L1 data cache to perform cache searches, thereby improving performance. This would also reduce the need for the cache control arbitration and address muxing, thereby resulting in faster cache access and enabling higher frequency, again improving performance.

Conventional CAM designs are 2-dimensional in nature. Having three or more CAM ports would increase the area of the CAM macro because more wiring tracks are needed to communicate the unique search tag for each CAM port to each CAM cell and because the CAM cells themselves would grow due to the area needed to perform the extra tag compares within each CAM cell. This area increase would result in longer wire travel distances which would cause the access time to slow down. A new solution for providing the benefits of a multi-ported CAM without the negative effects of increased travel distance is needed.

BRIEF SUMMARY

The present invention provides a multi-ported CAM cell in which the negative effects of increased travel distance have been substantially reduced. This is achieved in the present invention by utilizing three-dimensional integration in which multiple active circuit layers are vertically stacked and vertically aligned interconnects are employed to connect a device from one of the stacked layers to another device in another stacked layer.

By vertically stacking multiple active circuit layers with vertically aligned interconnects, each compare port of a multi-port CAM can be implemented on a separate layer above or below the primary data storage cell. This allows the multi-port CAM structure to be implemented within the same area footprint as a standard Random Access Memory (RAM) cell, minimizing data access and match compare delays. Each compare match line and data bit line has the length associated with a simple two-dimensional Static Random Access Memory (SRAM) cell array.

The inventive three-dimensional approach allows the interconnect delays of match lines and bit lines for a multi-port CAM to be comparable to those associated with the bit lines of a conventional two-dimensional RAM array. The match line access is improved over the standard 2D approach for single and multi-port CAM arrays. The base RAM layer can be identical to standard SRAM, eliminating the need for additional reticle enhancement techniques to be developed for a CAM cell.

In general terms, the present invention provides a multi-ported CAM comprising:

a plurality of compare elements (or circuitries) vertically stacked on top of or below, preferably on top of, a storage element (circuitry), said plurality of compare elements and said storage element are located in separate wafers and are interconnected by at least one vertically conductive filled via hole.

In a preferred embodiment of the present invention, each of the compare elements is located above the storage element.

Each compare element present in the inventive structure comprises a plurality of first field effect transistors that typically have a 9T configuration and the storage element comprises a plurality of second transistors typically having a 6T configuration. Each plurality of first transistors is located upon and within a top, active semiconductor layer of a first semiconductor-on-insulator substrate, while the plurality of second transistors are located upon and within a top, active semiconductor layer of a second semiconductor-on-insulator substrate. The first and second semiconductor-on-insulator substrates each include a buried insulating layer directly beneath the top, active semiconductor layer.

In one preferred embodiment, a multi-ported CAM cell is provided that includes:

a plurality of compare elements, each including a plurality of first transistors arranged in a 9T configuration, vertically stacked on top of a storage element including a plurality of second transistors arranged in a 6T configuration, said plurality of compare elements and said storage element are located in separate wafers and are interconnected by at least one vertically conductive filled via hole.

In addition to the above, the present invention also provides a method of fabricating the inventive multi-ported CAM cell. The inventive method which includes 3D integration and wafer bonding includes the steps of:

providing a first wafer including a plurality of first transistors located upon and within a surface of a first active semiconductor layer;

providing a second wafer including a plurality of second transistors located upon and within a surface of a second active semiconductor layer;

first bonding a surface of said second wafer to a surface of said first wafer to provide a bonded structure in which the plurality of first transistors are located above the plurality of second transistors;

providing at least one other wafer including a plurality of other transistors located upon and within a surface of at least one other active semiconductor layer;

second bonding the at least one other wafer to a surface of said second wafer to provide another bonded structure in which each plurality of transistors are vertically stacked upon each other; and forming at least one vertically filled conductive via to connect said plurality of transistors that are vertically stacked to each other.

DETAILED DESCRIPTION

The present invention, which provides a compact multi-port CAM cell and a method of fabricating the same, will now be described in greater detail by referring to the following discussion and drawings that accompany the present application. It is noted that the drawings are provided for illustrative purposes only. As such, the drawings included within the present application are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
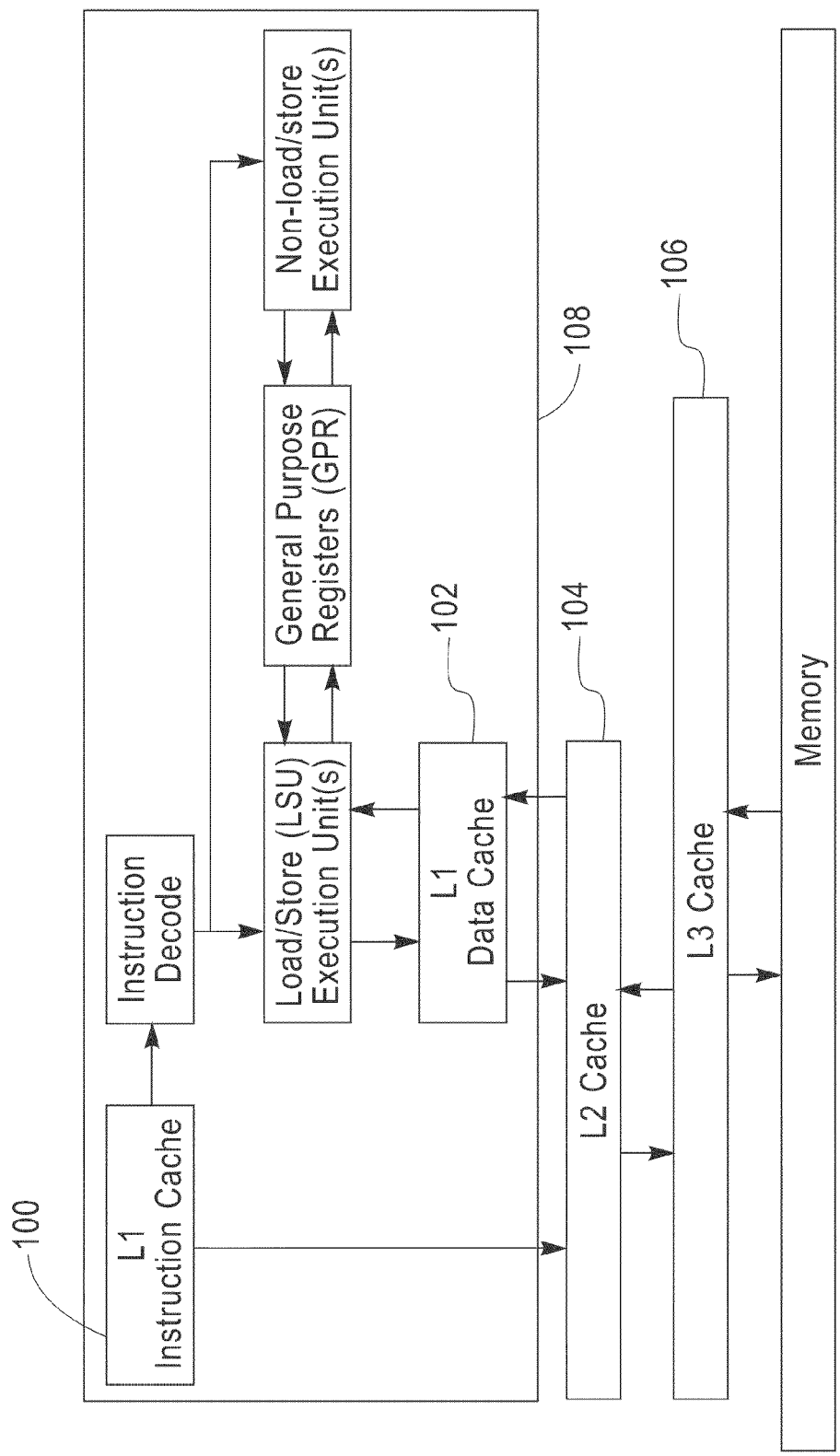
FIG. 1 is a system-level representation of a prior art microprocessor 108 (e.g., CPU) and its connection to a memory subsystem.
Figure 2:
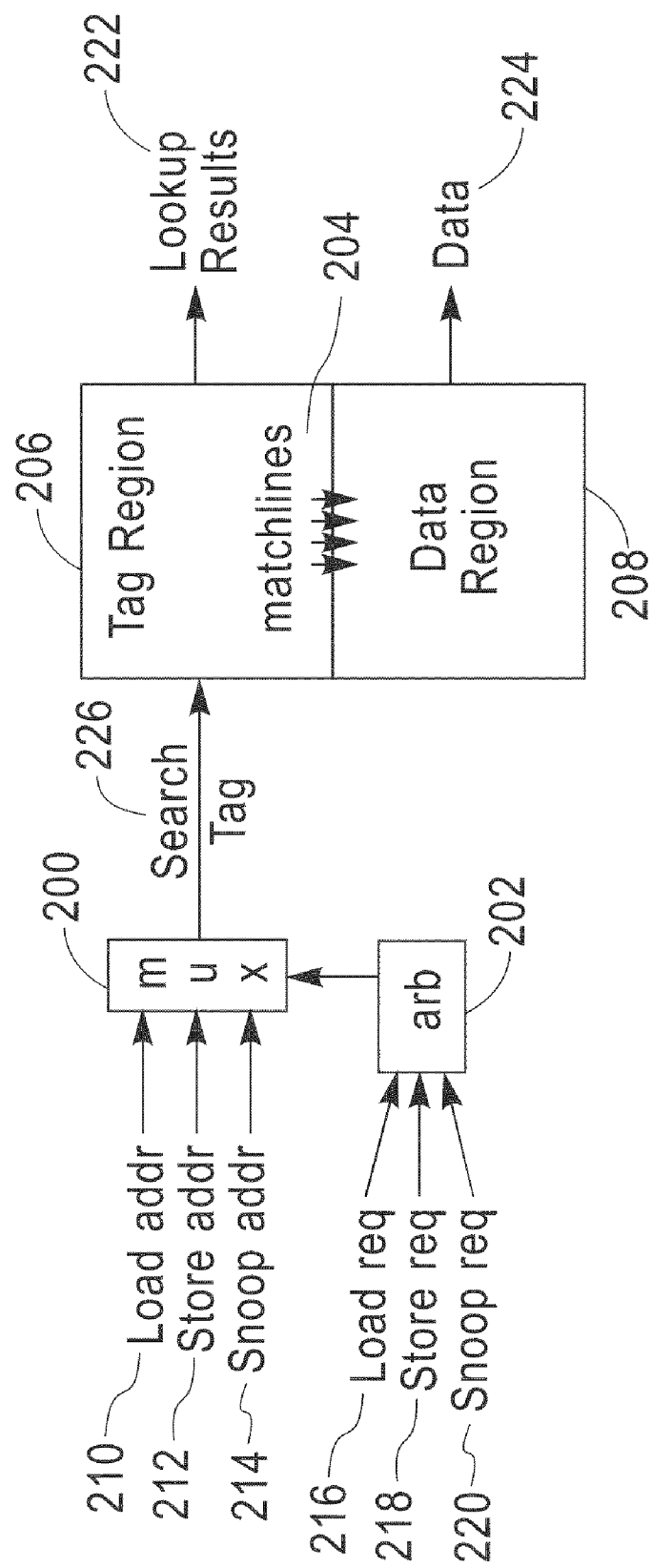
FIG. 2 is a block diagram representation of a prior art CAM-based L1 data cache.
Figure 3:
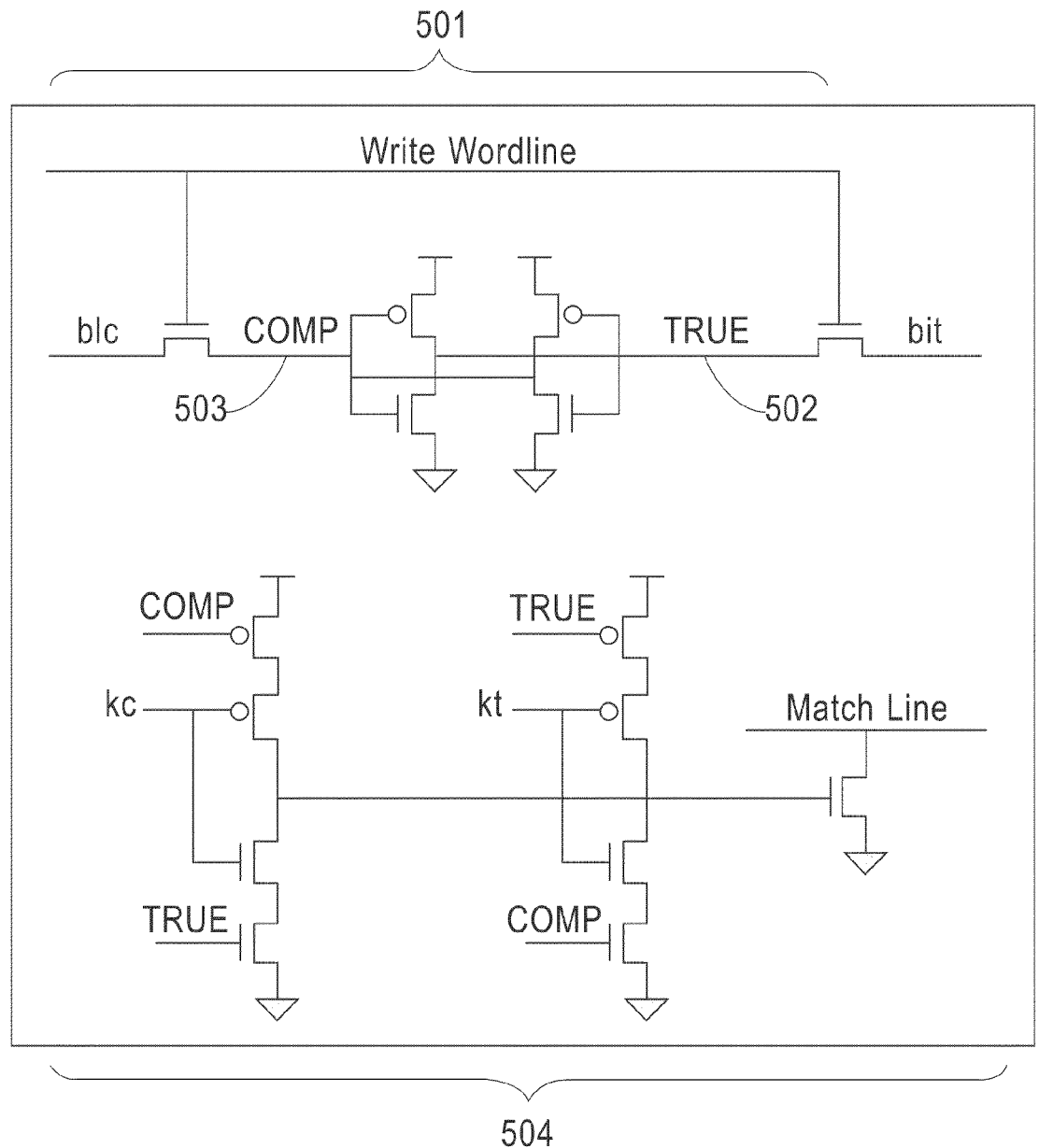
FIG. 3 is a pictorial representation (through a cross sectional view) illustrating two pieces that comprises a single port CAM cell.

Reference is first made to FIG. 3 which shows two pieces that comprise a single port CAM cell. The top six transistors 501 show the standard 6T cell where storage nodes (compa 503 & true 502) are comprised of two inverters and access to it is controlled using NFET pass gates. As is evident in the circuit schematics for the standard 6T cell, the storage node can include a first set of complementary metal oxide semi-conductor (CMOS) transistors including p-type field effect transistors and n-type field effect transistors. The bottom nine transistors (e.g., 9T) 504 show the compare circuitry and the NFET used to drive the match line. As is evident in the circuit schematics for the bottom nine transistors, the compare circuitry can include a second set of CMOS transistors including p-type field effect transistors and n-type field effect transistors.

On a single wafer design fabricated using 2D integration, these elements would be all laid out together. So the area footprint would be that of 6T area plus the area of 9T (compare circuitry). In the present invention, these two elements are split, placing the 6T storage cell on one wafer, and the 9T (compare circuitry) on another wafer. Multiple compare ports can be added on active layers bonded and aligned atop the original layer. Each layer can support a separate compare port. The logic, compare data ins and match lines out are implemented on that wafer. Storage nodes (e.g., labeled true and comp) are connected vertically through vias to the compare circuits above. An excessive load on the storage nodes can impair write ability. A true/complement generator buffer can be inserted in a layer above the storage cell to isolate the load of multiple compare devices from the storage nodes.

Figure 4A:
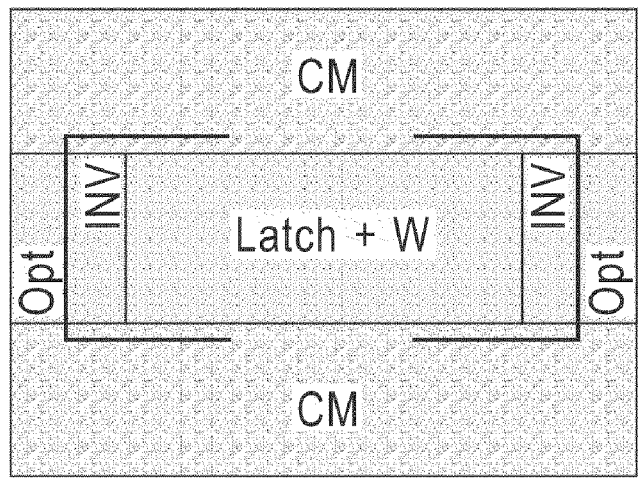
FIGS. 4A-4B are pictorial representations illustrating a prior art 2D CAM cell design and the inventive CAM cell design, respectively.
Figure 4B:
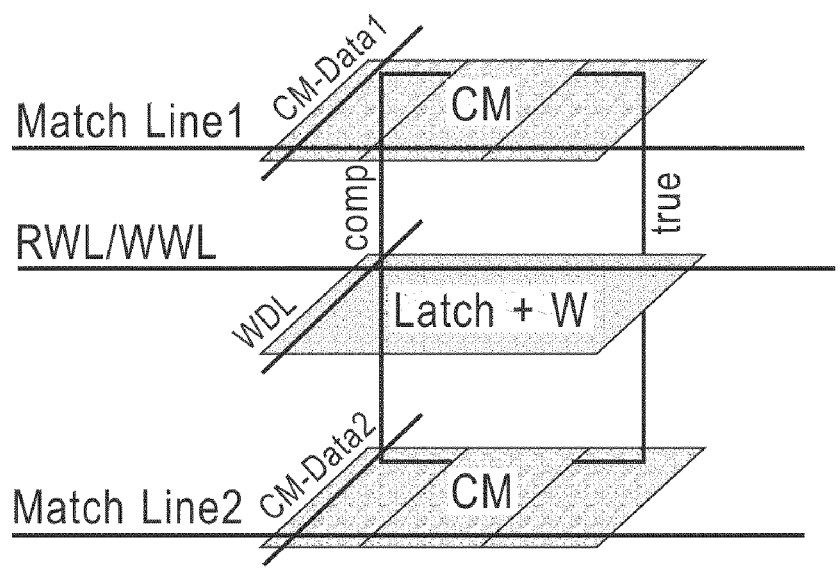

The resulting footprint would consist of the larger of two elements i.e., the 9T circuitry plus added area of vertical integrated nodes (true & complement). FIGS. 4A and 4B respectively show this above differentiation in graphical view. FIG. 4A is the prior art design, while FIG. 4B is the inventive design. In FIG. 4A, basic cell parts and connections are shown for a 2D cell with standard metal interconnections. The "Latch+W" block represents the memory latch of the cell and the write port circuitry of the cell to that memory latch. The two "CM' blocks represent two CAM port circuits. The line on the left represents the complementary node of the latch cell going to the CAMs, while the line on the right is the TRU node. Also shown in FIG. 4A are two optional invert circuits "opt. INV" for driving the comp and true nodes to the "CM" circuits.

FIG. 4B shows the inventive design basic parts of the CAM cell in a 3D interconnection environment. Labeling is the same as in FIG. 4A. The "comp" and "tru" signals from the memory cell latched is passed via a vertical interconnect, rather than a horizontal metal interconnect. "RWL/WWL" labels the read wordline select for the read port and the write wordline select for the write port to control the write to the cell. Match Line 1" and "Match Line 2" label the outputs of the "CM" CAM circuits to indicate when the data latched in the "Latch" part of the cell matches the compare data provided to the cell on "CM-Data 1" and "CM-Data 2", respectively.

One can observe that the overall footprint area (bird's eye view) is much less in FIG. 4B than in FIG. 4A. Smaller area of the resultant CAM cell has many benefits including, for example, shorter bit lines (write and read data), shorter match data lines, and shorter match lines, shorter word lines (write and read).

All of these benefits result in a CAM structure that is easier (faster) to write, and a marked improvement in CAM search because of shorter match data line and match lines. This aspect of the present invention is now described in further detail.

Figure 5:
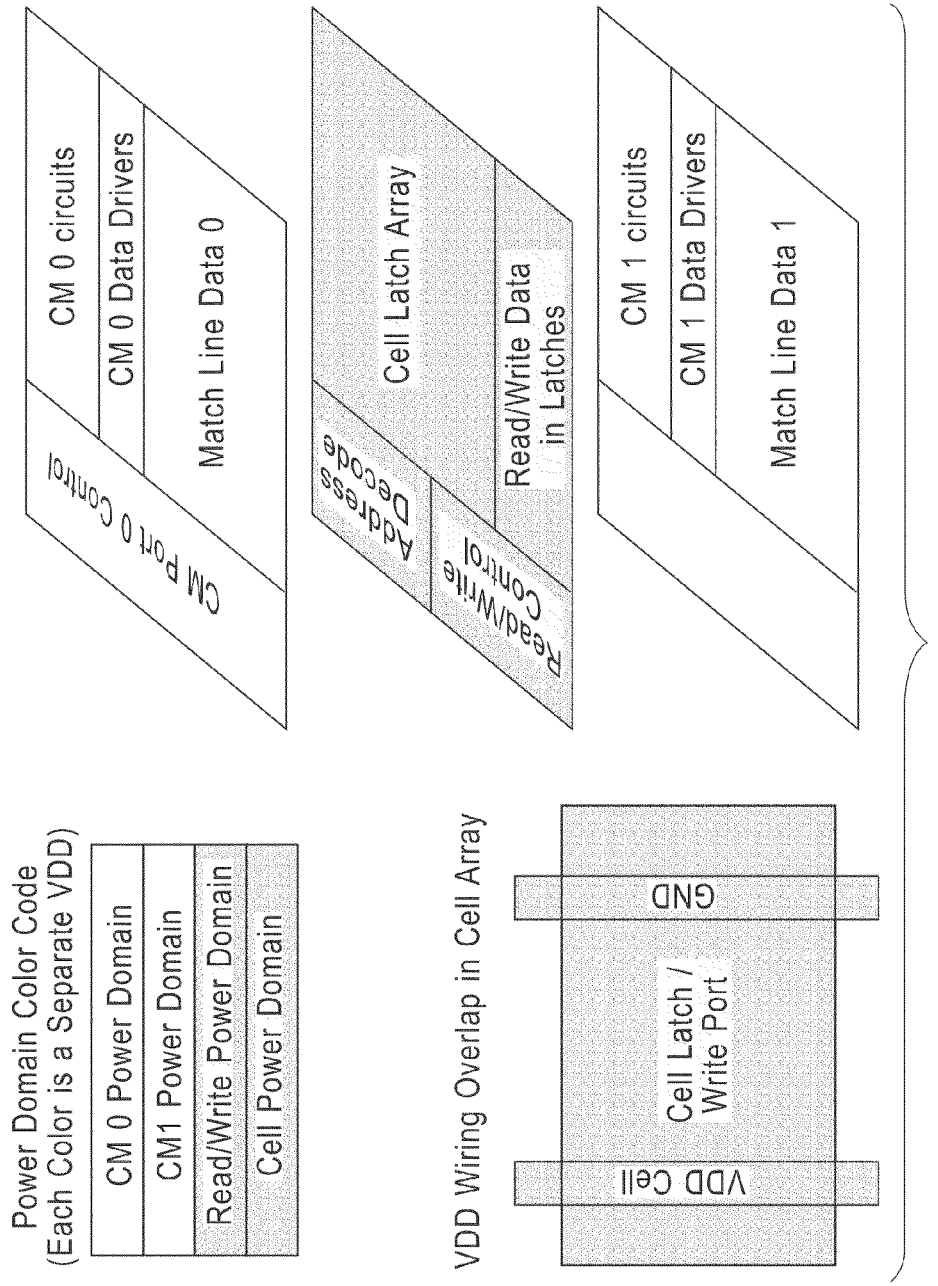
FIG. 5 is a schematic illustrating the power distribution on the inventive multi-CAM cell, where the wafer with the 9T (match circuitry) also includes the control logic for the match line, match data drivers and all the clocking and where the other wafer includes the 6T (storage node), read and write control logic, write data drivers and read scheme.

On a single wafer the CAM (6T+9T) circuits are so closely laid out, that it is almost impossible to give separate voltage domains to these elements without significantly increasing the area footprint, and also leads to added complexity for power distribution and the access area for power wires. FIG. 5 shows the power distribution on the inventive multi-wafer CAM cell, where wafer with 9T (match circuitry) also includes the control logic for match line, match data line drivers and all the clocking; likewise on the other wafer included are 6T (storage node), read and write control logic, write data drives and read scheme.

In a multi-wafer, the 6T and 9T lie physically on a separate wafer, where controlling power distribution could be done on a wafer to wafer basis; i.e., it is possible to have match circuitry and storage circuitry with lower or higher voltages with respect to each other. Timing critical paths could easily be supplied with a higher lower, or vice versa non critical circuits (higher margin) could be given a lower voltage. There may be a need of a voltage translator if storage cell is on a lower voltage than compare circuits, since true and complement lines are driven from the storage cell to the compare circuitry. Separation of 6T (cell) and 9T (compare) onto different wafers also allows for more granular power gating.

Another advantage of the inventive CAM cell is that it can completely turnoff the match circuitry, when architecturally match circuits are not being utilized, and the storage node core can be used as a standard register. The inventive CAM cell leaves flexibility for more innovative architectural solutions.

The actual area and timing differences between single wafer CAM (prior art) vs. multi-wafer CAM designs (present invention) will now be discussed.

Figure 6A:
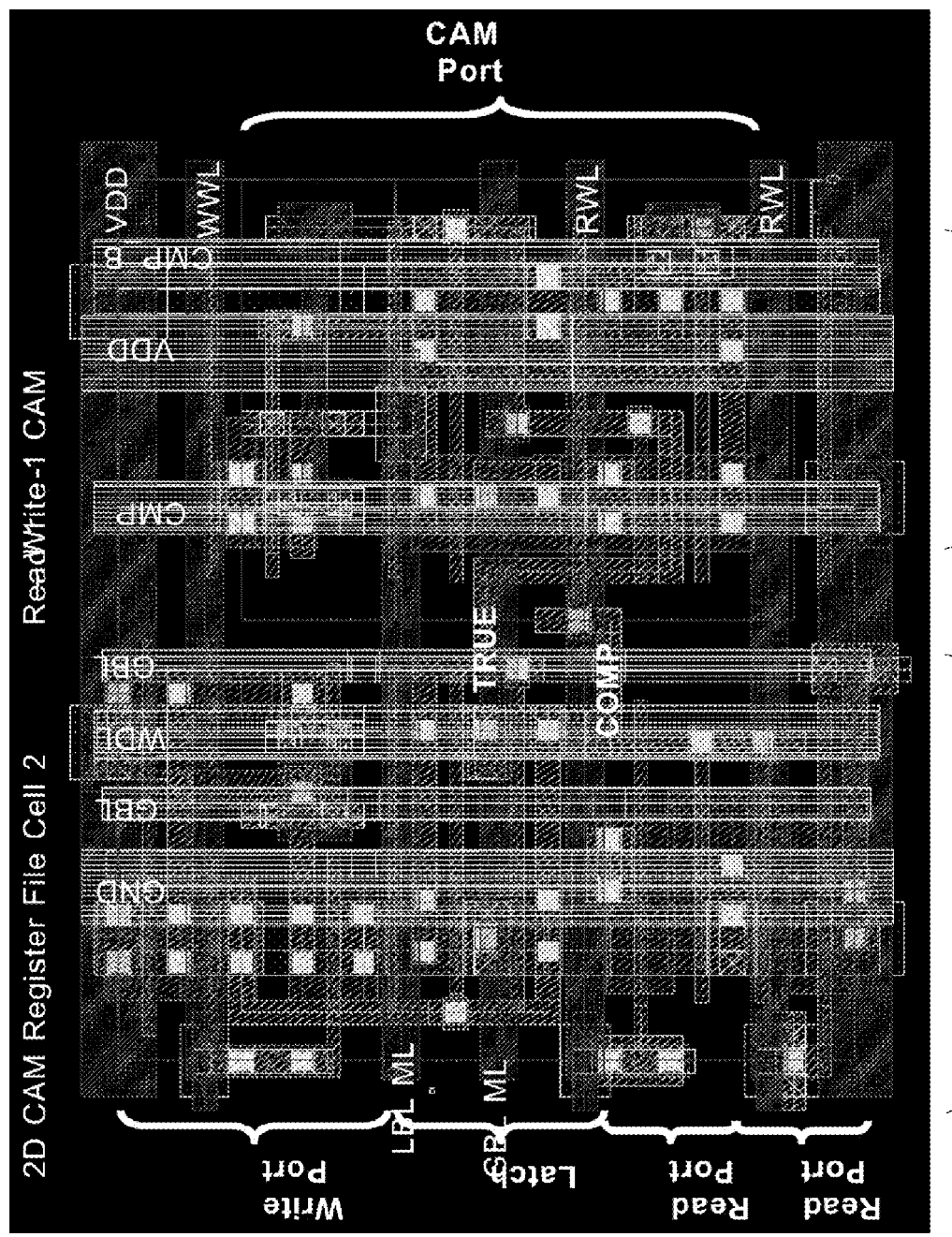
FIG. 6A shows a design layout of a 2 read, 1 write and a CAM (9T) cell.

FIG. 6A shows a prior art layout of a 2 read, 1 write and a CAM (9T) cell. This cell is also referred herein as a 2r1w1c cell. This 2r1w1c cell represented here is a register file CAM cell drawn out in 45 nm technology. In this layout, all elements (read, write, storage node, CAM) are densely integrated. The dimensions of this dense layout are 2.736 μm (width), and 2.28 μm (h).

Figure 6B:
FIG. 6B shows the inventive layout. On the left is shown the 2 read, 1 write and storage node, and on the right is the 9T (compare) circuitry.

FIG. 6A shows a prior art 2D CAM 2r1w1c register file cell. The 2 read ports, 1 write port and memory cell latch circuits are located on the left half of the cell and are labeled in the picture to show there veridical position. The CAM port circuit occupies the right half of the cell and is labeled "CAM port". Important signals are also labeled. "RWL"—Read Wordline, "WWL" write Wordline, "Gbl"—Global Bit line, VDD/GND, "CMP"—True Compare data to CAM, "CMP_B"—complementary compare data to CAM. It is important to note the connectivity of internal cell nodes of the "TRUE" and "COMP" wires of the cell to the CAM port on horizontal metal level 1 interconnect. In FIG. 6B which represents the inventive layout, the "TRUE" and "COMP" signals connect up a layer through vertical interconnect vias labeled as "wafer-to-wafer via". The CAM port in FIG. 6B is located on a separate layer place under a wafer layer that contains the two read ports, write port and latch of the cell. By under, the top metal of lower wafer is the nearest layer to the substrate of the upper wafer layer.

FIG. 6B shows the two pieces of the layout; on the left is the 2 read, 1 write and storage node 801; on the right is the 9T (compare) circuitry 802. The latch core is the constructed on the top wafer, and the CAM is laid out on the bottom wafer, and these two elements are connected together with the true and comp nodes using vertical interconnects. The connection to the latch core is made at the M1 metal level and on the bottom wafer the connection to the CAM is made at the C1 (M4) metal. M1 is the lowest metal data could be driven out of the storage cell, and C1 is the highest metal being used in the CAM. This way vertical interconnect distance is kept at a minimum, whereby reducing the overall capacitance and resistance. The dimensions of the storage cell are 1.368 μm (width), and 2.66 μm (height); and the dimensions of the CAM circuitry is 1.368 μm (width) and 1.52 μm (height). As one can see the latch core (storage cell) circuitry has a larger footprint than the CAM, so the latch core area will dictate the overall dimensions of the array. However, additional CAM ports can be added vertically to the 3D stack without an increased 2D footprint. In actuality, a single wafer multi-port CAM implementation would likely be larger than the sum of the areas of the latch core and the compare circuits in order to accommodate wiring for the additional compare ports.

The heights of the dense CAM cell (2.52 μm) and latch node (2.66 μm) in this modular 2r1w1c are similar, so one would NOT realize any improvements in vertically timed paths. Some of these vertically timed paths are 1. Read: local bit line readout, local receiver, global bit line readout 2. Write data arrival time 3. Match Data Arrival Time. The delay through these paths would remain the same because of NO reduction in height by going to 3D integrated cell.

However, now comparing the widths 2.736 μm for the dense arrays vs. 1.368 μm in the 3D integrated array (per bit cell column), one observes that the width is half of its original size. The reduced width has many timing benefits including, for example:

Read word line propagation delay is reduced
a. For a 32 bit array in 45 nm technology with wire 1.5× spacing and 1.5 width, one would see approximately 2-3 pico seconds (ps) improvement in read word line propagation delay.

Write word line propagation delay is reduced
a. More margin in cell write ability if the write data arrives before the word line
b. For a 32 bit array in 45 nm technology with wire 1.5× spacing and 1.5 width, one would see approximately 2-3 Pico seconds improvement in write word line propagation delay.

Match Line delay improvement
a. For a 32 bit array in single wafer, CAM search takes 129 ps, breakdown of this 48 ps are taken for compare (true & comp) data launch, and other 81 ps are taken in the propagation of match line through local and global scheme and latching into cross-coupled nand. This delay degrades with each additional single wafer compare port. For a single wafer 3-port CAM implementation, match line propagation is 108 ps, with a CAM search time of 156 ps.
b. For a 32 bit array in multi-wafer, CAM search takes 118 ps, breakdown of this 48 ps are taken for compare (tru & comp) data launch, and other 70 ps are taken in the propagation of match line through local and global scheme and latching into cross-coupled nand.

Since the height remains approximately the same (2.66 μm vs. 2.28 μm), the delay of the match data is the same between both 2-D vs. 3-D CAM arrays. However, the 3-D CAM array sees an improvement of 11 ps in the CAM search, which is an improvement of 8.5% in one of the timing critical paths of the processor. The 3-port CAM array sees an improvement of 38 ps, or 24%.

In order to achieve the multi-ported CAM cell of the present invention, three-dimensional (3D) integration and packaging technology (also know as vertical integration) is employed. In such a technology, multiple layers of active devices are stacked with vertical interconnection between the layers to form 3D integrated circuits (ICs). 3D ICs provide potential performance advancements even in the absence of continued device scaling, as each transistor in a 3D IC can access a greater number of nearest neighbors and each circuit functional block has higher bandwidth. Other benefits of 3D ICs are improved packing density, noise immunity, improved total power due to reduced wire length and hence lower load capacitance, potential performance benefits, and ability to implement added functionality (mixed technologies).

A preferred embodiment for the fabrication of wafer scale 3D Integration is accomplished via the bonding of independently-fabricated layers of a semiconductor-on-insulator substrate. Each layer is designed and checked as an independent chip with its own metallization layers, but with the addition of vacant vertical via channels for the later placement of the vertical via. Upper layers are all processed to their last metal, and a temporary clear glass handle is glued to the top. The bottom of the wafer is then polished, removing the back silicon, and most of the SOI buried oxide. This wafer is then aligned and then Si-bonded to the top of the base layer using low temperature and high pressure bonding. The handle substrate is then removed by either laser-ablating or dissolving the adhesive. The vertical via holes are etched down through the upper layer, reaching the base layer wiring underneath; these vias are then lined and filled in much the same process as a conventional metal via. A final wiring layer is then applied on top of the completed vertical via, and either terminal metals or another silicon layer may be placed on top.

Reference is now made to FIGS. 7A-7D which are pictorial representations illustrating the basic processing steps which are employed in the present invention for fabricating the inventive multi-ported, multi-wafer CAM. In these drawings, two wafers are shown, by way, of example. Although two wafers are used in these drawings the present invention typically utilizes at least three wafers. In fact, the present invention contemplates cases where pluralities of wafers are stacked one on top of the other utilizing 3D integration.

Figure 7A:
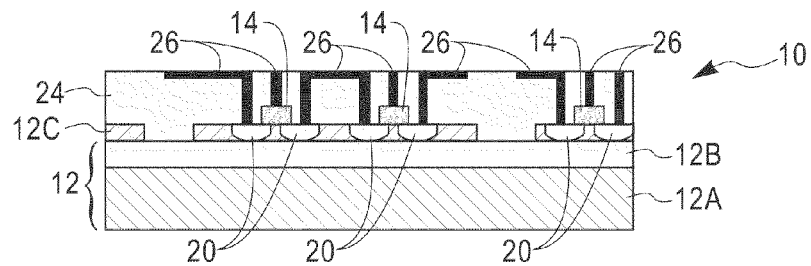
FIGS. 7A-7D are pictorial representations illustrating the basic processing steps that are employed in the present invention in fabricating a compact multi-port CAM cell.

Reference is first made to FIG. 7A which illustrates a first structure (i.e., processed wafer) 10 that can be employed in the present invention. The first structure (or first wafer) 10 includes a processed SOI substrate 12 which includes a bottom semiconductor layer 12A, a buried insulating layer 12B and a top, active semiconductor layer 12C. As is shown, the top, active semiconductor layer 12C includes a plurality of semiconductor devices, for example field effect transistors 14 located upon and within the top, active semiconductor layer 12C. Note that the top, active semiconductor layer has been patterned as shown in FIG. 7A.

The top and bottom semiconductor layers 12C and 12A, respectively, comprise any semiconductor material including for example, Si, SiGe, SiC, SiGeC, GaAs, InP, InAs, and multilayers thereof. Preferably, the top and bottom semiconductor layers 12C and 12A, respectively, comprise Si. The buried insulating layer 12B comprises a crystalline or non-crystalline dielectric including oxides, nitrides, oxynitrides and multilayers thereof. Preferably, the buried insulating layer 12B comprises an oxide.

Each transistor 14 includes at least a gate dielectric (such as an oxide) and a gate conductor (such as doped polysilicon or a metal gate). The plurality of transistors may also include at least one sidewall spacer (not shown) and source/drain regions 20 that are located within the top, active semiconductor layer 12C. The SOI substrate, and the components of the transistors are well known to those skilled in the art. Also, methods of making SOI substrates as well field effect transistors are also well known to those skilled in the art. In order not to obscure the invention details concerning the foregoing elements have been omitted.

The structure shown in FIG. 7A also includes at least one dielectric material 24 which includes conductive filled openings 26 (in the form of vias and vias/lines) which extend to the top of the gate conductor as well as the source/drain regions 20. The at least one dielectric material 24 and the conductive filled openings 26 represent an interconnect structure (or wiring structure) that is made using conventional techniques well known in the art. The at least one dielectric material 24 comprises any well known dielectric including, for example, $SiO_2$, silsesquioxanes and C-doped oxides. Porous as well as non-porous dielectric materials can be used. The conductive filled openings 26 comprise a conductive material including, for example, W, Al, Cu and alloys such as AlCu. A liner material such as TiN or TaN may be present in the conductive filled openings 26.

Figure 7B:
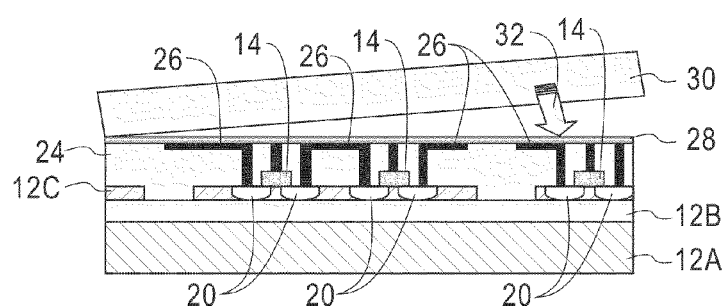

After providing the structure shown in FIG. 7A, an optional adhesive or bonding aid layer 28 is formed on the upper exposed surface of the interconnect structure providing the structure shown in the lower portion of FIG. 7B. The optional adhesive or bonding aid layer 28 comprises, for example, an oxide or a silane. The optional adhesive or bonding aid layer 28 is formed utilizing a conventional deposition process including, for example, chemical vapor deposition (CVD), plasma enhanced chemical vapor deposition (PECVD), or spin-on coating. FIG. 7B also shows the presence of a handling substrate 30 which is brought into contact with the uppermost surface of the structure 10, i.e., either the optional adhesive or bonding layer 28, if presence, or directly to the surface of the dielectric material 24. Arrow 32 indicates the application to the uppermost surface of structure 10.

Figure 7C:
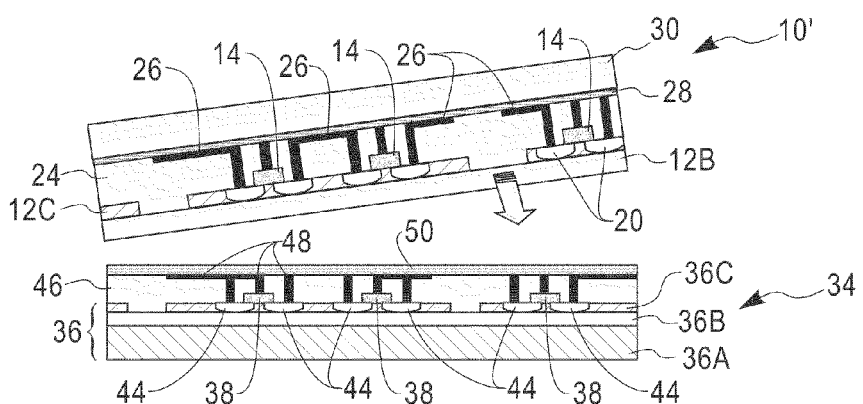

Next, and as also illustrated in FIG. 7C, the bottom semiconductor layer 12A of the SOI substrate is removed utilizing a planarization process such as chemical mechanical polishing (CMP). During this planarization process, the buried insulating layer 12B is typically thinned from an initial thickness to a first thickness. The structure is now referred to as first structure (or first wafer) 10'.

Before, during or after thinning, a second structure (i.e., processed wafer) 34 is formed utilizing standard processing techniques that are well known to those skilled in the art. The second structure 34 includes an SOI substrate 36 which includes a bottom semiconductor layer 36A, a buried insulating layer 36B and a top, active semiconductor layer 36C. Note that the bottom semiconductor layer 36A, the buried insulating layer 36B and the top, active semiconductor layer 36C may comprise the same or different materials as used above for the SOI substrate 12.

The second structure 34 also includes a plurality of field effect transistors 38 that are located upon and within the top, active semiconductor layer 36C. The plurality of transistors 38 of the second structure 34 includes a gate dielectric, a gate conductor, and source/drain regions 44. The second structure 34 also includes at least one dielectric material 46 that includes conductive filled openings 48 that are formed in the at least one dielectric material 46. The at least one dielectric material 46 and the conductive filled openings 48 may comprise the same or different materials as their corresponding elements described above in the first structure. An oxide layer 50 may optionally be formed atop the dielectric material 46 of the second structure.

Next, and as illustrated in FIG. 7C, a desired surface of the second structure 34 is brought into intimate contact with a desired surface of the first structure 10' as is processed in FIG. 7B. Typically, the thinned buried oxide layer 12B of the first structure 10' is brought into intimate contact with the oxide layer 50 of the second structure. Bonding is then performed utilizing any conventional bonding technique known to those skilled in the art. For example, the bonding may be achieved utilizing a nominal room temperature bonding process (temperature from about 20° to about 40° C.) or bonding may be achieved at higher temperatures. Various post bonding anneal processes may be used to enhance the bonding strength.

After bonding at least the first and second structures 10' and 36 together, the handling substrate 30 is removed by a conventional technique including, for example laser ablation, planarization, or etching. The adhesive or bonding aid layer 28 is typically also removed by this step of the present invention.

Other structures (i.e., processes wafers) can be formed atop the second structure as desired utilizing the same basic processing techniques as described above. The other structures include other CAM compare ports of the inventive CAM cell. For the sake of clarity, the drawings depict only a single compare port being vertically stacked upon a memory port. As will be understood by those skilled in the art, a plurality of wafers including compare elements can be vertically stacked atop the structure shown in FIG. 7C after the handling substrate 30 has been removed.

Figure 7D:
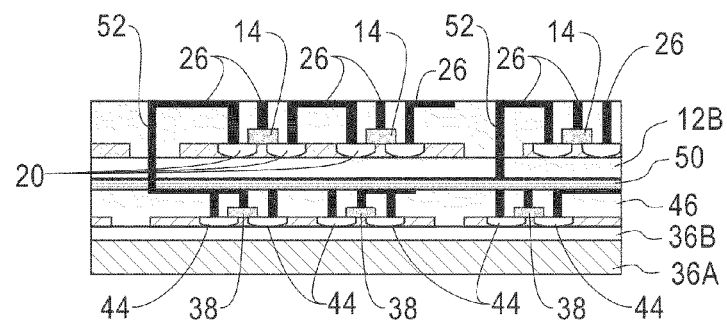

Vertical via holes are then formed by lithography and etching down from the now exposed upper surface layer of dielectric material 24 reaching the conductive filled openings 48 of the second structure 36. The vias are then lined with a liner material (e.g., TiN, TaN or WN) and the remaining portion of the vertical via holes is filled with a conductive material. FIG. 7D illustrates the final structure including the conductive filled vertical via holes 52. Conventional interconnect process can then be performed as desired. When multiple compare elements are vertical stacked upon the storage element, the conductive filled vertical via holes would connect the compare transistors present in the uppermost wafer to then other compare transistors in the underlying wafers as well as to the storage element transistors in the lowest most wafer.

In one embodiment of the present invention, the plurality of transistors 14 in the first structure 10' may have a 6T configuration, while the plurality of transistors 38 in the second structure 34 may have a 9T configuration. The 6T configuration typically forms the storage element of the inventive CAM cell, while the 9T configuration typically forms the compare elements of the inventive CAM cell. In another embodiment, the plurality of transistors 14 in the first structure 10' may have a 9T configuration, while the plurality of transistors 38 in the second structure 34 may have a 6T configuration.

As such, the method described above, provides a multi-ported CAM cell including a a plurality of compare elements (or circuitry) located in a plurality of individual wafers (or structures) vertically stacked on top of, or below, a storage element (or circuitry) located in a a separate wafer (or structure), said plurality of compare elements and said storage element are interconnected by at least one vertically conductive filled via hole. Preferably, each of the compare elements is located above the at least one storage element.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a multi-ported CAM cell comprising:
   providing a first structure including at least a first active semiconductor layer and a first interconnect structure, wherein a first plurality of field effect transistors (FETs) is present in said first active semiconductor layer, and said first interconnect structure includes a first dielectric material and first conductive filled openings embedded therein and extending to said first plurality of field effect transistors;
   bringing a handling substrate into direct contact with an uppermost surface of said first structure;
   providing a second structure including at least a second active semiconductor layer and a second interconnect structure, wherein a second plurality of FETs is present on said second active semiconductor layer, and said second interconnect structure includes a second dielectric material and second conductive filled openings embedded therein and extending to said second plurality of field effect transistors, wherein one of said first plurality of FETs and said second plurality of FETs includes a storage element comprising a first set of complementary metal oxide semiconductor (CMOS) transistors, and the other of said first plurality of FETs and said second plurality of FETs includes a compare element comprising a second set of CMOS transistors;
   bringing a bottom surface of said first structure into contact with an uppermost surface of said second structure;
   forming a bonded structure, wherein said bonded structure includes at least said first structure and said second structure, and said first structure is bonded with said second structure within said bonded structure;
   removing said handling substrate from said bonded structure; and
   forming conductive filled vertical via holes that connect said first set of CMOS transistors to said second set of CMOS transistors to form multi-ported Content Addressable Memory (CAM) cells in which said storage element overlies or underlies said compare element, wherein said bonded structure includes at least another additional structure bonded to said second structure, wherein each of said at least another additional structure includes at least an additional active semiconductor layer and an additional interconnect structure, wherein another plurality of FETs is present on said additional active semiconductor layer.

2. The method of claim 1, wherein said first and second structures are brought into intimate contact with each other and are bonded to each other at a temperature that is about 20° C. or greater during said bonding of said first and second structures.

3. The method of claim 1, wherein said conductive filled vertical via holes are formed by first forming vertical via holes from an exposed upper surface of said first interconnect structure to said second conductive filled openings within said second interconnect structure, and then by filling said vertical via holes with a conductive material.

4. The method of claim 1, wherein said second set of CMOS transistors has a 9T configuration and said first set of CMOS transistors has a 6T configuration.

5. The method of claim 4, wherein said second set of CMOS transistors is located above said first set of CMOS transistors.

6. The method of claim 1, wherein said conductive filled vertical via holes are aligned to said first and second conductive filled openings.

7. The method of claim 1, further comprising forming vertical via holes from an exposed upper surface of said first interconnect structure to said second conductive filled openings within said second interconnect structure; and
   filling said vertical via holes with a conductive material to form conductive filled vertical via holes.

8. The method of claim 1, wherein said storage element and read and write control logic devices configured to control read and write operations of said storage elements are located in one of said first and second active semiconductor layers, and said compare element and devices for providing control logic for match lines, match data line drivers, and clocking devices and configured to control operations of said compare element are located in the other of said first and second active semiconductor layers.

9. The method of claim 1, wherein said first structure includes a stack, from bottom to top, of at least a first bottom semiconductor layer, a first buried insulating layer, said first active semiconductor layer, and said first interconnect structure.

10. The method of claim 9, wherein said second structure includes a stack, from bottom to top, of at least a second bottom semiconductor layer, a second buried insulating layer, said second active semiconductor layer, and said second interconnect structure.

11. The method of claim 9, further comprising removing said first bottom semiconductor layer from said first structure after said handling substrate is brought into contact with said first structure and before bonding said first structure with said second structure.

12. The method of claim 9, further comprising removing said first bottom semiconductor layer utilizing a planarization process prior to said bonding of said first structure with said second structure.

13. The method of claim 12, further comprising thinning said first buried insulating layer from an initial thickness to a first thickness during said planarization process.

14. The method of claim 1, wherein said uppermost surface of said first structure is a surface of said first interconnect structure.

15. The method of claim 1, further comprising applying an adhesive or bonding aid layer directly on said upper exposed surface of said first interconnect structure, wherein said said uppermost surface of said first structure is a top surface of an adhesive or bonding layer.

16. The method of claim 15, further comprising removing said adhesive or bonding aid layer prior to said bonding said first structure with second structure.

17. The method of claim 1, wherein said additional interconnect structure includes an additional dielectric material and additional conductive filled openings embedded therein and extending to said additional plurality of field effect transistors, wherein additional plurality of FETs includes another compare element comprising an additional set of CMOS transistors.

18. The method of claim 17, wherein said conductive filled vertical via holes connect said first set of CMOS transistors and said second set of CMOS transistors to said additional set of CMOS transistors, wherein said additional compare element underlies or overlies said storage element and said compare element.

19. The method of claim 18, wherein said conductive filled vertical via holes are configured to pass signals among said compare element and said storage element and said additional compare element.

20. The method of claim 1, wherein said conductive filled vertical via holes are configured to pass signals between said compare element and said storage element.

\* \* \* \* \*